United States Patent
Chung et al.

(10) Patent No.: US 8,591,711 B2
(45) Date of Patent: Nov. 26, 2013

(54) METHOD AND CHAMBER FOR INDUCTIVELY COUPLED PLASMA PROCESSING FOR CYLINDERICAL MATERIAL WITH THREE-DIMENSIONAL SURFACE

(75) Inventors: Sung Il Chung, Pohang-si (KR); Sergey Alexandrovich Nikiforov, Miryang-si (KR); Hyeon Seok Oh, Suwon-si (KR); Pan Kyeom Kim, Miryang-si (KR); Hyeon Taeg Gim, Miryang-si (KR); Jeong Woo Jeon, Changwon-si (KR)

(73) Assignees: Korea Electrotechnology Research Institute, Gyeongsangnam-do (KR); New Optics, Ltd., Gyeonggi-do (KR)

( * ) Notice: Subject to any disclaimer, the term of this patent is extended or adjusted under 35 U.S.C. 154(b) by 52 days.

(21) Appl. No.: 13/054,180

(22) PCT Filed: Sep. 29, 2008

(86) PCT No.: PCT/KR2008/005734
§ 371 (c)(1),
(2), (4) Date: Jan. 14, 2011

(87) PCT Pub. No.: WO2010/008116
PCT Pub. Date: Jan. 21, 2010

(65) Prior Publication Data
US 2011/0253674 A1 Oct. 20, 2011

(30) Foreign Application Priority Data
Jul. 14, 2008 (KR) .................. 10-2008-0067915

(51) Int. Cl.
C23C 14/00 (2006.01)
C25B 11/00 (2006.01)
C25B 13/00 (2006.01)

(52) U.S. Cl.
USPC ............. 204/298.28; 204/298.15; 118/723 I; 156/345.48

(58) Field of Classification Search
USPC ............... 204/298.28; 118/723 I; 156/345.48
See application file for complete search history.

(56) References Cited

U.S. PATENT DOCUMENTS 3,644,191 A * 2/1972 Matsushima ............ 204/298.06
6,076,482 A 6/2000 Ding et al.
(Continued)

FOREIGN PATENT DOCUMENTS

JP         04354878 A  * 12/1992 ............. C23C 16/50
KR  10-2005-0102505 A    10/2005

OTHER PUBLICATIONS

Abstract of JP04-354878.*

*Primary Examiner* — Keith Hendricks
*Assistant Examiner* — Ibrahime A Abraham
(74) *Attorney, Agent, or Firm* — Frommer Lawrence & Haug LLP; Ronald R. Santucci

(57) ABSTRACT

The present invention relates to an inductively coupled plasma processing chamber and method for a cylindrical workpiece with a three-dimensional profile, and more particularly to an inductively coupled plasma processing reactor and method for a cylindrical workpiece with a three-dimensional profile, in which the workpiece serving as an internal RF antenna is connected to an RF power source through an impedance matching network at one end, and a terminating capacitor at another end so as to achieve low plasma contamination, confine dense uniform plasma in the substrate vicinity and suppress secondary electrons emitted from the substrate, and a plasma process can be applied to a 3-D linear semiconductor device, a metal, glass, ceramic or polymer substrate having planar or 3-D structured micro or nano patterns, and the like.

18 Claims, 6 Drawing Sheets

(56) References Cited

U.S. PATENT DOCUMENTS 6,328,865 B2 * 12/2001 Matsumoto et al. ..... 204/298.26
6,390,020 B1 * 5/2002 Hu et al. ................... 118/723 E
6,554,954 B2 4/2003 Ma et al.
6,764,658 B2 * 7/2004 Denes et al. ............. 422/186.04
2002/0102858 A1 8/2002 Wicker et al.

* cited by examiner

[Fig. 1]
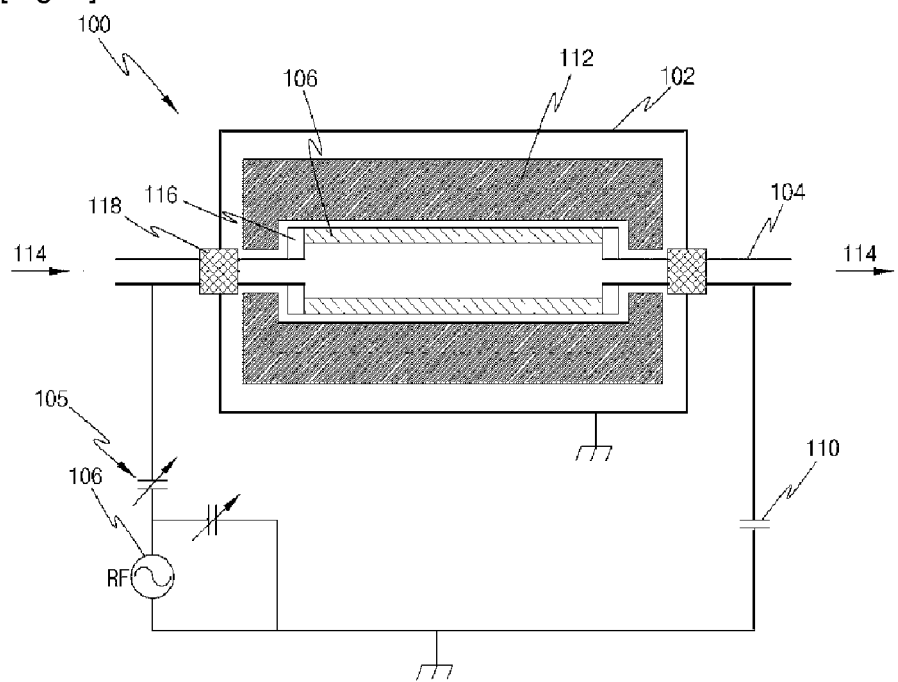
[Fig. 2]
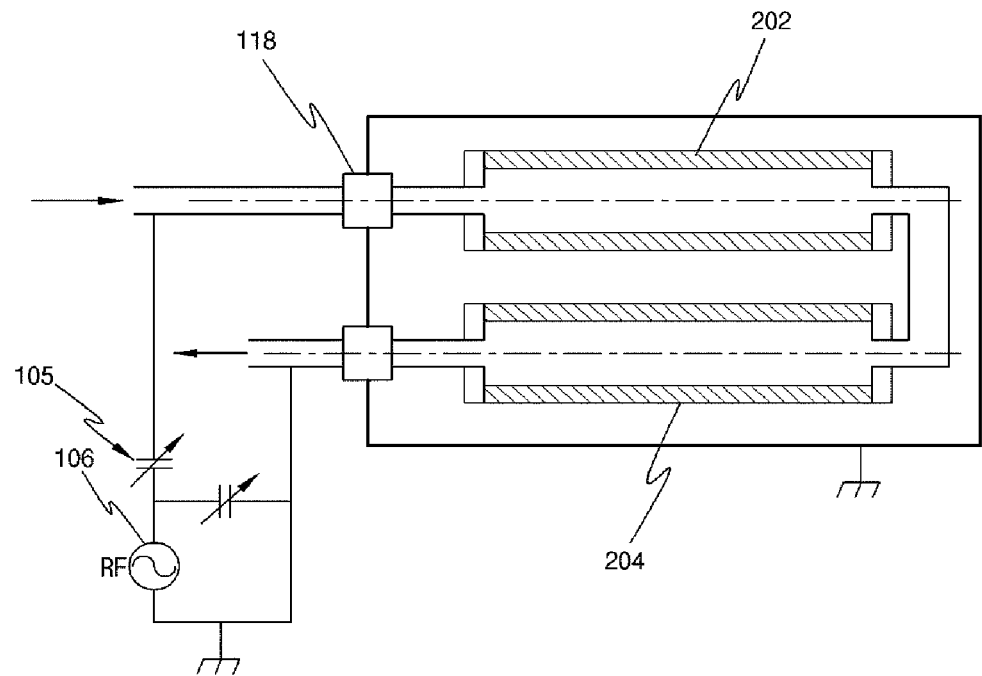

[Fig. 3]
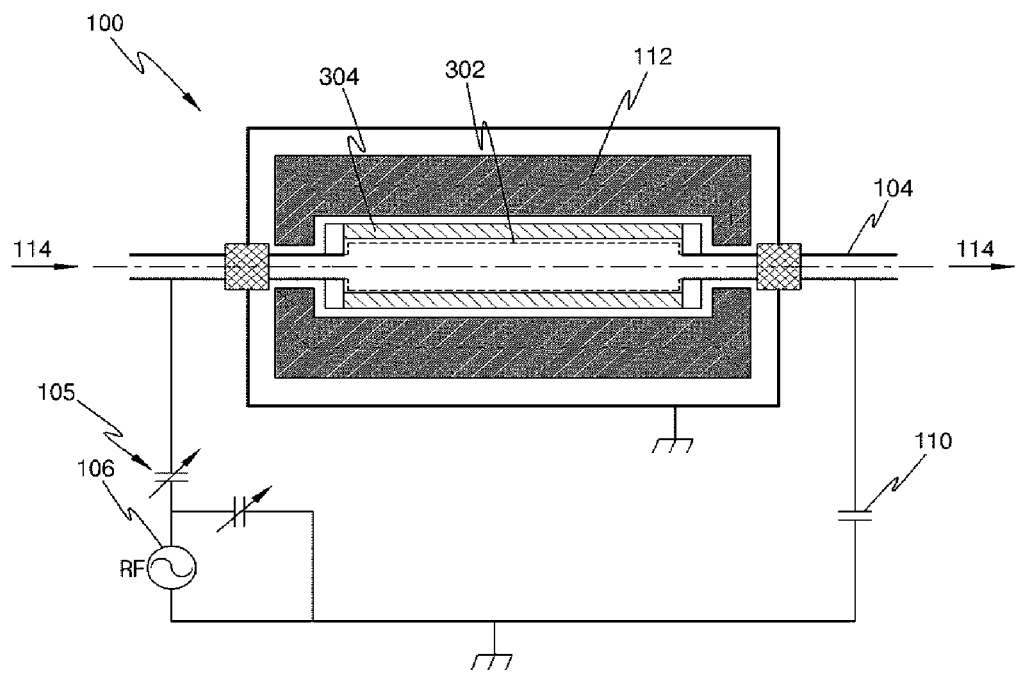
[Fig. 4]
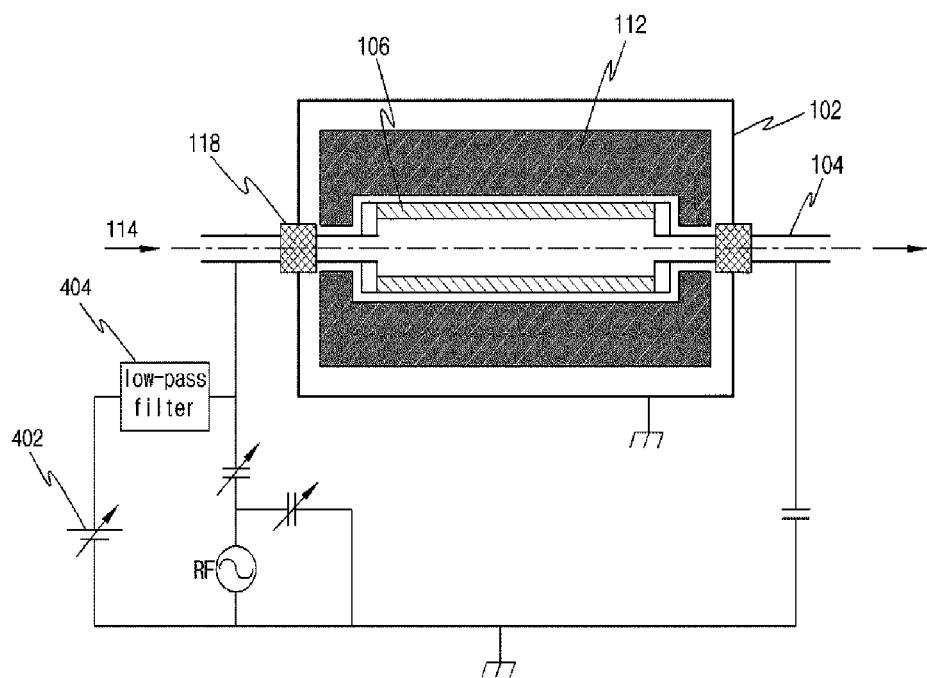

[Fig. 5]
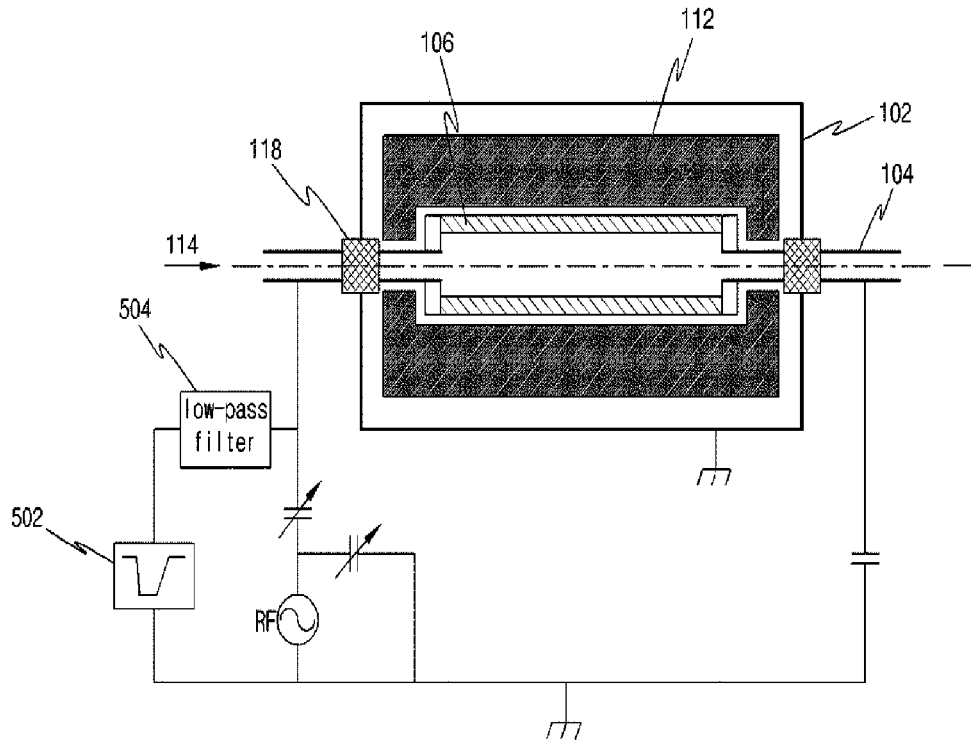
[Fig. 6]
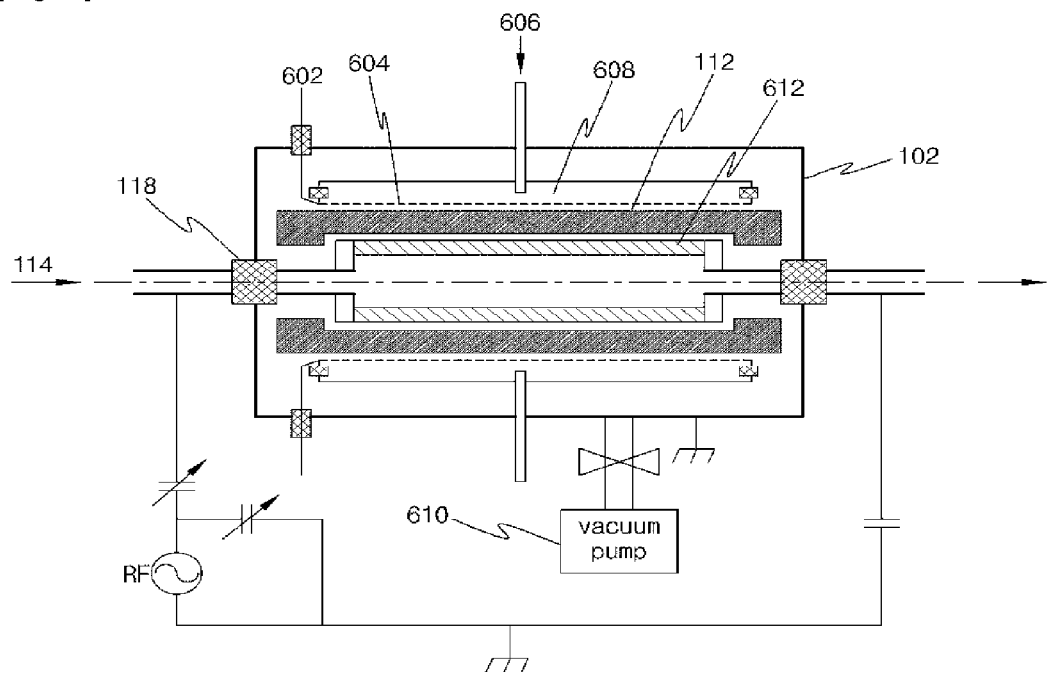

[Fig. 7]
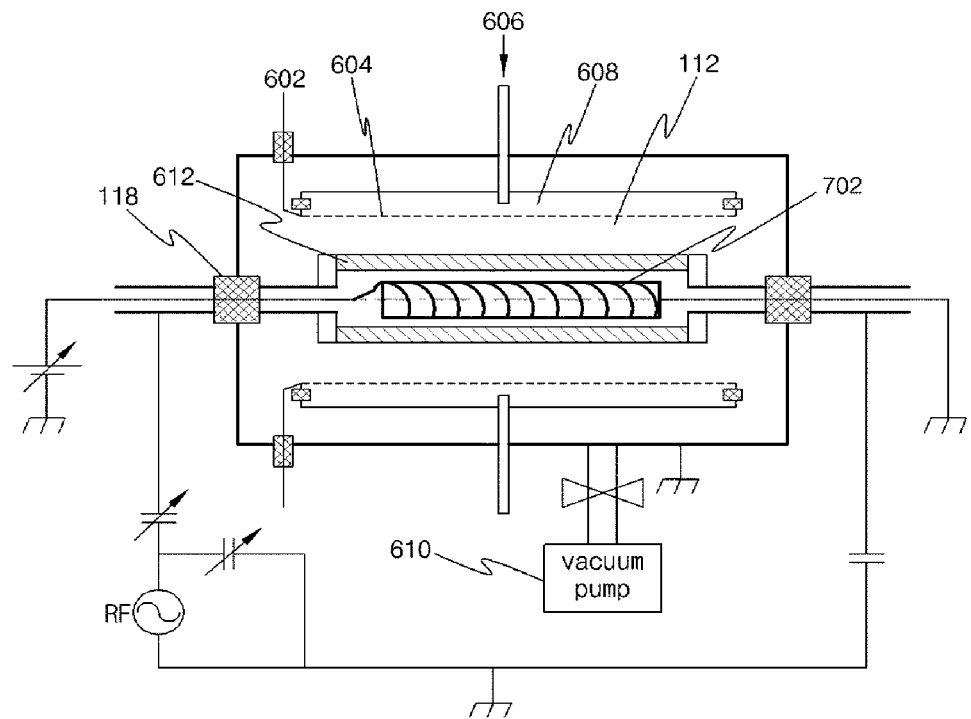
[Fig. 8]
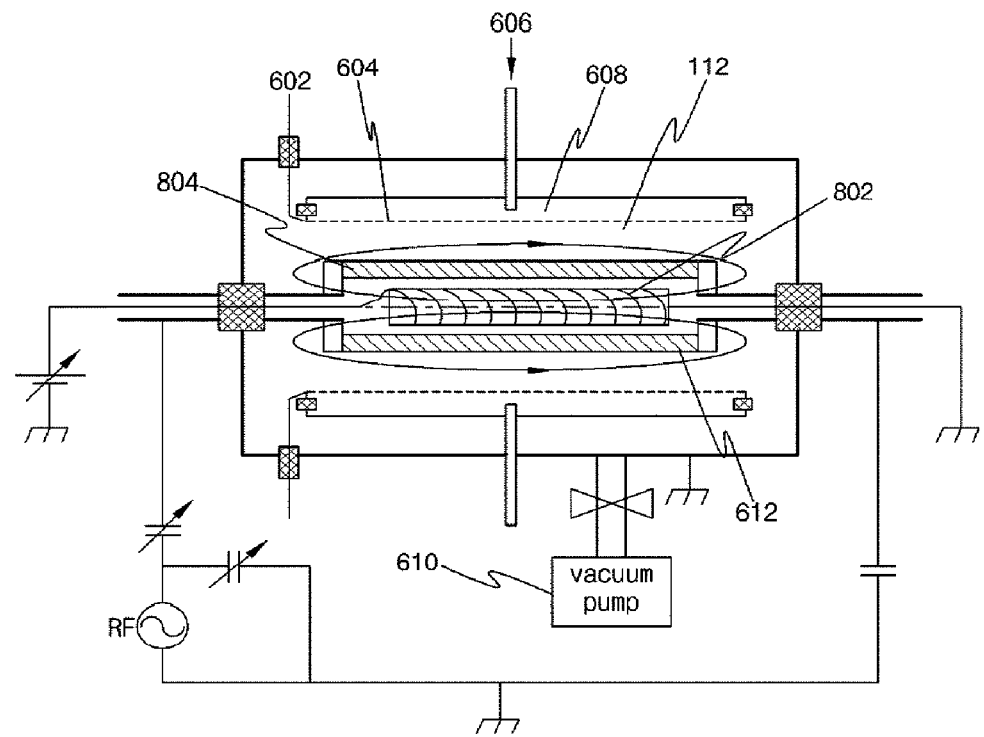

[Fig. 9]
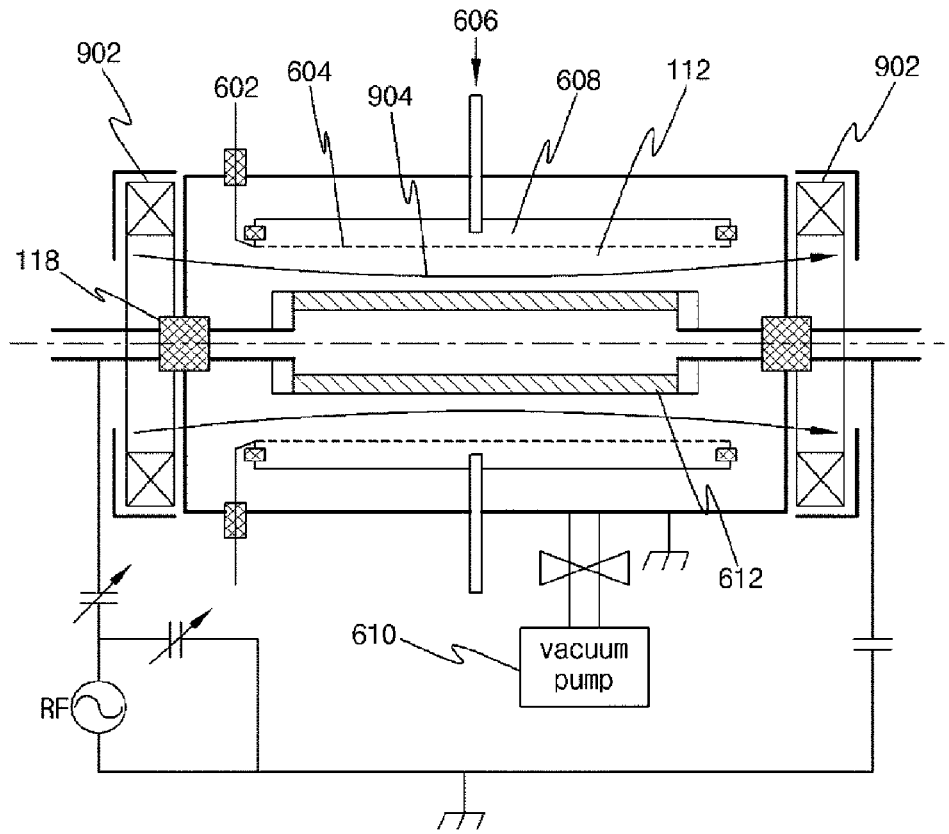
[Fig. 10]
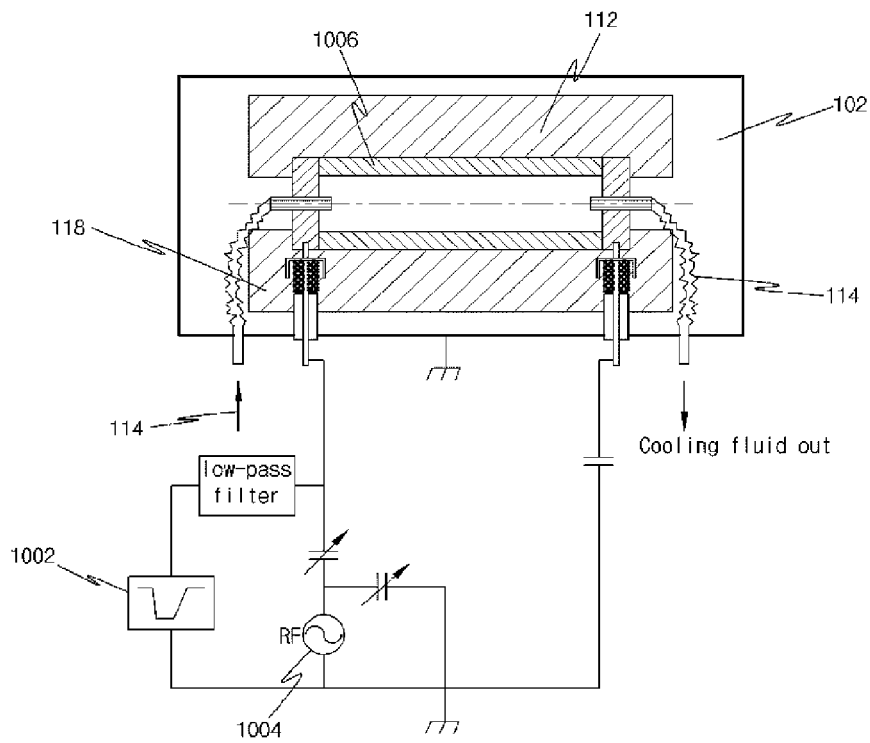

[Fig. 11]
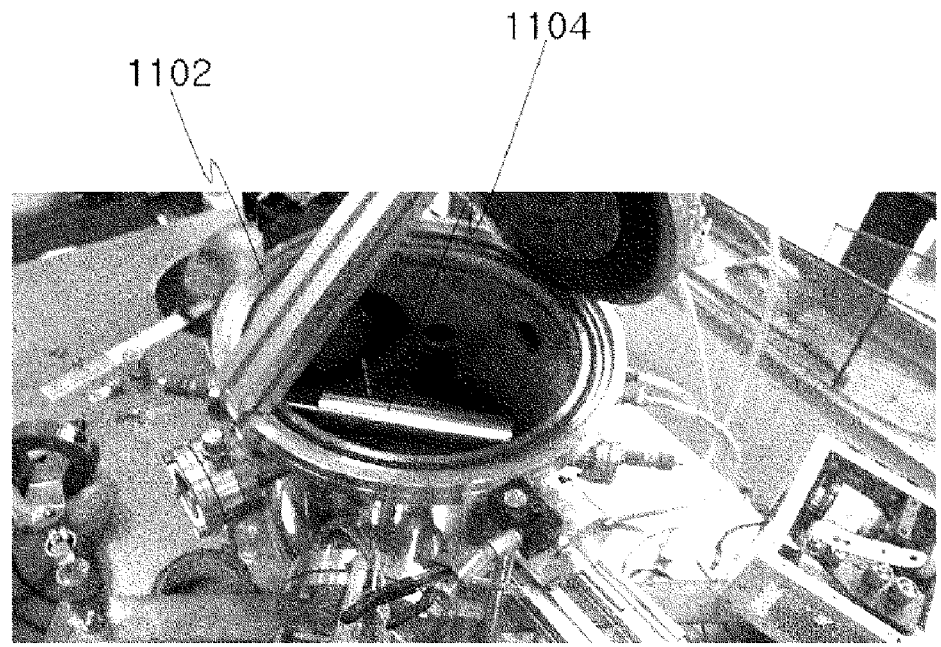
[Fig. 12]
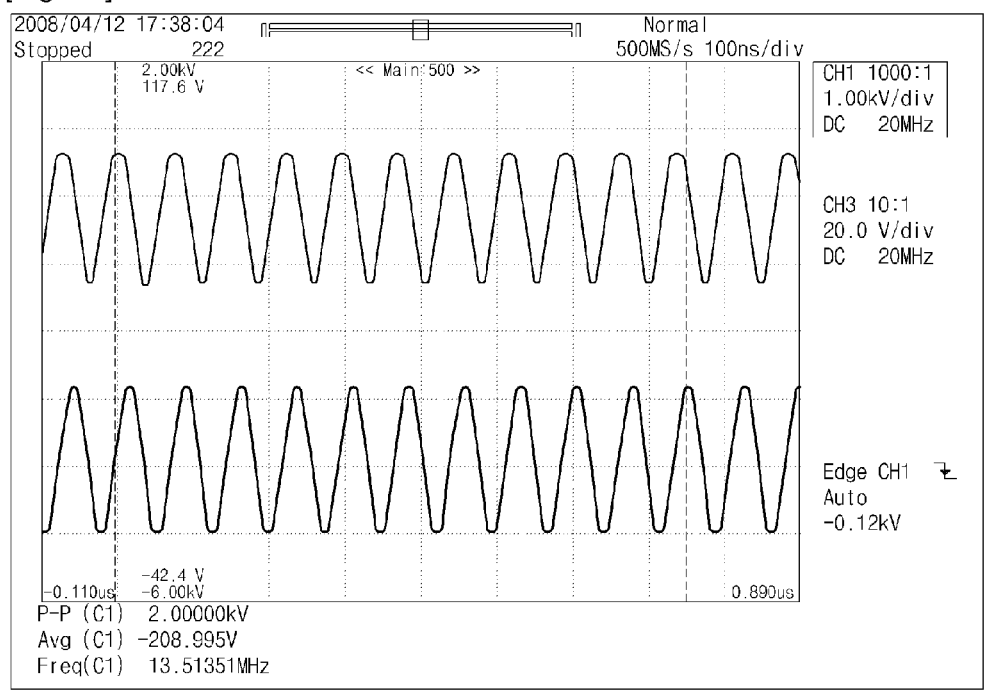

METHOD AND CHAMBER FOR INDUCTIVELY COUPLED PLASMA PROCESSING FOR CYLINDERICAL MATERIAL WITH THREE-DIMENSIONAL SURFACE

This application is a 371 of PCT/KR2008/005734 filed on Sep. 29, 2008 published on Jan. 21, 2010 under publication number WO 2010/008116 A which claims priority benefits to Korean Patent Application Number 10-2008-0067915 filed Jul. 14, 2008, the disclosure of which is incorporated herein by reference.

TECHNICAL FIELD

The present invention relates to an inductively coupled plasma processing apparatus having an internal antenna, and more particularly to an inductively coupled plasma processing chamber and method for a cylindrical workpiece with a three-dimensional profile.

BACKGROUND ART

Generally, an inductively coupled plasma (hereinafter, referred to as "ICP") is widely used in semiconductor processing, micro electro mechanical system (MEMS) fabrication, for functional and tribological coatings, and the like.

Since the ICP provides higher plasma density even at a relatively low processing pressure of ~1 mTorr as compared to capacitively coupled plasma (CCP), it possesses higher process throughput and better surface treatment conformity. In addition, the ICP features lower mean electron energy (temperature) and plasma potential, thus making better process control and lower contamination. However, capacitive coupling (CC) between RF antenna and plasma in ICP is an issue to be overcome in applications like dry etching, for example. A Faraday shield (FS) is used to damp the CC in a conventional ICP apparatus. An ICP apparatus having a function of controlling the value of such capacitive coupling has been proposed by S. A. Nikiforov.

ICP sources can be divided into the following two groups depending on whether an RF antenna is immersed in the plasma (called, "internal antenna ICP") or is placed outside of the plasma process chamber (called, "exterior antenna ICP"). The latter type is mostly used in semiconductor processing. One of the reasons is lack of the Faraday shield for the former.

State-of-the-art plasma processing devices of this ICP apparatus is concentrated on the semiconductor industry for processing a planar silicon (Si) wafer. Thus, researches are in active progress on shape and structure of the ICP antenna, change in plasma behavior according to the electrical mutual relationship between the antenna and the substrate for the sake of improvement of plasma uniformity on the planar silicon wafer, process control and lower contamination-based process execution, etc.

However, the exterior antenna ICP has limited scalability in association with its application to a large area owing to the following drawbacks:

First, an increase in the area of a vacuum window (generally, quartz is mainly used) requires an accompanying increase in window thickness to maintain structural integrity. Hence, the separation between the antenna and plasma also leads to lower RF power transfer efficiency.

Second, a thick vacuum dielectric window is expensive.

Third, a larger area or volume workpiece implies an increase in size of the window area and the RF antenna, thereby resulting in an increase in its inductance. The latter leads to an increase in required RF voltage, and hence, the capacitive coupling between antenna and plasma which in turn leads to contamination due to the window sputtering. Besides, an increase of antenna inductance requires a corresponding decrease of the RF matching capacitance. The latter should be larger than the system stray capacitance to provide a matching control.

Fourth, the overall length of a helical or spiral antenna widely used to obtain a high-efficiency and high-density plasma increases due to the large-scaling of the process chamber or the substrate. Consequently, non-uniformity of sources deteriorate spatial uniformity of the coupling between antenna and plasma. In case of application of 13.56 MHz RF power to the antenna, a problem of the standing wave effect and the like is caused by a half wavelength antenna source.

Fifth, it is difficult to provide uniform plasma across a large area for a planar workpiece and through a large volume for a three-dimensional (3-D) workpiece.

The information disclosed in this Background of the Invention section is only for enhancement of understanding of the background of the invention and should not be taken as an acknowledgment or any form of suggestion that this information forms the prior art that is already known to a person skilled in that art.

DISCLOSURE OF INVENTION

Technical Problem

The present invention has been made in view of the above problems occurring in the prior art, and it is an object of the present invention to provide an inductively coupled plasma processing chamber and method for a cylindrical workpiece with a three-dimensional profile, in which the workpiece serving as an internal RF antenna is connected to an RF power source through an impedance matching network at one end, and a terminating capacitor at another end so as to achieve low plasma contamination, confine dense uniform plasma in the substrate vicinity and suppress secondary electrons emitted from the substrate, and a plasma process can be applied to a 3-D linear semiconductor device, a metal, glass, ceramic or polymer substrate having planar or 3-D structured micro or nano patterns, and the like.

Technical Solution

In order to accomplish the above object, in one aspect, the present invention provides an inductively coupled plasma processing reactor for a cylindrical workpiece with a three-dimensional profile, the plasma processing reactor including:

a grounded vacuum chamber made of a conductive material and having an outer wall;

workpiece bearing means connected to the outer wall of the vacuum chamber in such a fashion as to be electrically insulated from the vacuum chamber;

at least one cylindrical workpiece mounted around the workpiece bearing means, the cylindrical workpiece being connected to an external RF power source through an impedance matching network at one end and a terminating capacitor at the other end; and a cylindrical gas shower electrode disposed inside the vacuum chamber so as to surround the workpiece.

Particularly, the cylindrical workpiece is made of a conductive material.

Also, the cylindrical workpiece is either any one of aluminum, titanium, stainless steel and brass, or a combination of two or more thereof.

In addition, the reactor further comprises a conductive mesh formed on the inner circumferential surface of the cylindrical workpiece if the cylindrical workpiece is made of an insulating material.

Moreover, the gas shower electrode is combined with a sputter electrode.

Further, the inside of the cylindrical workpiece is separated from the process chamber by vacuum sealing, and cooling water is allowed to be introduced into the cylindrical workpiece.

Also, the plasma processing reactor further includes a temperature control heater coaxially disposed within the conductive cylindrical workpiece for controlling the temperature of the cylindrical workpiece.

In addition, the plasma processing reactor further includes a coil coaxially mounted inside the cylindrical workpiece if the cylindrical workpiece is made of a non-magnetic material.

Besides, the plasma processing reactor further includes a pair of Helmholtz coils fixedly mounted outside the process chamber coaxially with the workpiece so as to provide a magnetic field.

Also, the plasma processing reactor further includes workpiece rotating means connected to the workpiece bearing means for rotating the cylindrical workpieces.

Further, the plasma processing reactor further includes a negative DC or pulsed DC bias source connected to the cylindrical workpeice to provide its biasing inside the process chamber.

In addition, the pulsed DC bias source has an amplitude of from 100 to 200,000 V, a width of from 0.2 to 200 ms, and a pulse duty factor of from 0.001 to 0.5.

Further, a frequency of the RF power source 106 is selected so to minimize a standing wave effect and a transmission line effect along the cylindrical workpiece.

Also, the workpiece bearing means is connected to the ground.

Besides, the strength of the magnetic field is adjusted to provide resonance increase of RF power absorption by the plasma and minimize escape of secondary electrons from the cylindrical workpiece.

In the meantime, in another aspect, the present invention provides a method of plasma processing a cylindrical workpiece with a three-dimensional profile using a plasma processing reactor comprising: a grounded vacuum chamber made of a conductive material and having an outer wall; workpiece bearing means connected to the outer wall of the vacuum chamber in such a fashion as to be electrically insulated from the vacuum chamber; at least one cylindrical workpiece mounted around the workpiece bearing means, the cylindrical workpiece being connected to an external RF power source through an impedance matching network at one end and a terminating capacitor at the other end; and a cylindrical gas shower electrode disposed inside the vacuum chamber so as to surround the workpiece, the method comprising the steps of:

(a) applying RF power to the cylindrical workpiece through the impedance matching network;

(b) forming plasma inside the vacuum chamber through generation of resonance by the applied RF power;

(c) creating a negative DC selfbias on the workpeice due to a difference in mobility of ions and electrons; and (d) processing the workpiece using plasma ions accelerated within the formed plasma Particularly, the step (d) further comprises (e) evenly supplying a process gas to the surface of the workpiece through the gas shower electrode.

Advantageous Effects

The inductively coupled plasma processing reactor and method for a cylindrical workpiece with a three-dimensional profile of the present invention has the following advantageous effects.

First, surface cleaning, etching, deposition and ion implantation processes limited to a conventional planar type substrate can be easily applied to a three-dimensional substrate.

Second, the ICP process can be performed even at lower pressure, thereby providing a cleaner work environment.

Third, owing to plasma control by the control of both temperature and magnetic field of a substrate with a three-dimensional profile, a micro and nano-pattern transfer technology can be applied to the substrate surface.

Fourth, it is possible to distribute dense uniform plasma along the surface of the substrate with a three-dimensional profile and maximum density plasma in the vicinity of the substrate surface.

Fifth, since the plasma process can be applied to a substrate of a three-dimensional profile with a large area or volume, i.e., a 3-D linear semiconductor device, a sample with a variety of cross sections for tribological applications, a photoreceptor drum of a photo transfer machine, a metal, glass, ceramic or polymer substrate having planar or 3-D structured micro or nano patterns, and the like, it is expected to achieve a considerable commercial and economical effects.

BRIEF DESCRIPTION OF DRAWINGS

The above and other objects, features and advantages of the present invention will be apparent from the following detailed description of the preferred embodiments of the invention in conjunction with the accompanying drawings, in which:

FIG. 1 is a schematic view showing an ICP process chamber with a conductive cylindrical workpiece serving as an internal RF antenna according to one embodiment of the present invention;

FIG. 2 is a schematic view showing an ICP process chamber with two conductive cylindrical workpieces connected in series and serving as an internal RF antenna according to another embodiment of the invention;

FIG. 3 is a schematic view showing an ICP process chamber with a dielectric cylindrical workpiece having a conductive metal mesh formed on the inner circumferential surface thereof and serving as an internal RF antenna according to yet another embodiment of the invention;

FIG. 4 is a schematic view showing an ICP process chamber with a conductive cylindrical workpiece serving as an internal RF antenna, wherein a DC bias source is connected to the workpiece according to yet another embodiment of the invention;

FIG. 5 is a schematic view showing an ICP process chamber with a conductive cylindrical workpiece serving as an internal RF antenna, wherein a pulsed bias source is connected to the workpiece according to yet another embodiment of the invention;

FIG. 6 is a schematic view showing an ICP process chamber with a conductive cylindrical workpiece serving as an internal RF antenna, wherein a sputter source surrounds the workpiece to provide PVD, ionized PVD, etching/PVD, or PI3D process according to yet another embodiment of the invention;

FIG. 7 is a schematic view showing an ICP process chamber with a conductive cylindrical workpiece serving as an internal RF antenna, wherein a sample heater is provided inside the workpiece according to yet another embodiment of the invention;

FIG. 8 is a schematic view showing an ICP process chamber with a conductive cylindrical workpiece serving as an internal RF antenna, wherein a coil is mounted inside the workpiece to provide a magnetic field along the outer circumferential surface of the workpiece according to yet another embodiment of the invention;

FIG. 9 is a schematic view showing an ICP process chamber with a conductive cylindrical workpiece serving as an internal RF antenna, and a pair of Helmholtz coils for plasma confinement and plasma density increase, according to yet another embodiment of the invention;

FIG. 10 is a schematic view showing an ICP process chamber with a conductive cylindrical workpiece serving as an internal RF antenna, according to yet another embodiment of the invention;

FIG. 11 is a photograph of experiment setup wherein an Al 6061 cylindrical substrate (dia 80×200 mm) is mounted within a 18-liters PI3D chamber to serve as an internal antenna of an ICP source; and FIG. 12 is an oscillogram showing the measurement result of an RF voltage (Ch. 1) and current (Ch. 3) through the cylindrical workpiece in the ICP setup shown in FIG. 11.

BEST MODE FOR CARRYING OUT THE INVENTION

Now, the construction and operation of the preferred embodiments of the present invention will be described with reference to the accompanying drawings. The construction and operation of the present invention shown in the drawings and described by referring to the drawings is explained as at least one embodiment, and the technical spirit of the present invention and its core construction and operation is not limited thereby.

Further, as the terminology used herein, general terms are selected which are widely used at present, but in a specific case, terms arbitrarily selected by the present applicant may be used. In such a case, it is to be noted that since the meanings of the used terms are definitely taught in a corresponding portion of the detailed description, they should not be simply construed as only the nominal meanings of terms used in the detailed description of the present invention, but should be construed by grasping the implied meanings of the corresponding terms.

Generally, an inductively coupled plasma source having an internal antenna is advantageous in the processing of a material having a large area or volume. In the present invention, a large cylindrical workpiece with a three-dimensional profile serves as an internal RF antenna of the inductively coupled plasma processing apparatus.

Now, an ICP process chamber with a conductive cylindrical workpiece serving as an internal RF antenna will be described hereinafter with reference to FIG. 1.

The ICP process chamber 100 includes a vacuum chamber connected to the ground, made of a conductive material and having an outer wall 102, workpiece bearing means 104 connected to the outer wall 102 of the vacuum chamber in such a fashion as to be electrically insulated from the vacuum chamber, and a cylindrical workpiece 106 mounted around the workpiece bearing means.

The cylindrical workpiece 106 according to a preferred embodiment of the present invention has a diameter of from 1 cm to 40 cm and a length of from 10 cm to 200 cm. The cylindrical workpiece is connected to an external RF power source through an impedance matching network 108 at one end and a terminating capacitor 110 at the other end. By doing so, a negative RF self-bias is established on the surface of the cylindrical workpiece 106 upon the discharge of plasma 112.

In this case, a frequency of the RF power source 106 is selected so to minimize a standing wave effect and a transmission line effect along the cylindrical workpiece.

Also, the electrically insulated workpiece bearing means 104 can be grounded so as to avoid a discharge voltage due to the standing wave effect.

Moreover, the cylindrical workpiece 106 may be made of a conductive material, for example, aluminum (Al), titanium (Ti), stainless steel.

In addition, fluid 114 of a certain temperature is passed through the inside of the cylindrical workpiece so as to separate the inside of the cylindrical workpiece from the process chamber by vacuum sealing (116).

Also, the plasma process can be performed at a process pressure between 0.2 mTorr and 100 mTorr obtained by admitting a process gas into the vacuum chamber.

FIG. 2 is a schematic view showing an ICP process chamber with two conductive cylindrical workpieces connected in series and serving as an internal RF antenna according to another embodiment of the invention.

Like this, a plurality of cylindrical workpieces 202 and 204 can be connected with each other in series so as to simultaneously carry out the plasma process.

In FIG. 2, there has been shown the construction in which two cylindrical workpieces are connected in series, but the interconnection between the cylindrical workpieces is not limited to thereto. That is, the cylindrical workpieces may be overlapped with each other or arranged at a predetermined gradient relative to each other. Also, the cylindrical workpieces can rotate, in which case, a driving motor or the like for rotating the cylindrical workpieces is additionally connected to the workpiece bearing means 104.

FIG. 3 is a schematic view showing an ICP process chamber with a dielectric cylindrical workpiece 304 having a conductive metal mesh 302 formed on the inner circumferential surface thereof and serving as an internal RF antenna according to yet another embodiment of the invention.

That is, in case where the cylindrical workpiece 304 is made of an insulating material, a conductive coaxial mesh 302 is provided within the cylindrical workpiece 304, such that both ends thereof are connected to the RF power source 106. Thus, a negative RF self-bias voltage is created on the surface of the cylindrical workpiece 304 upon the discharge of plasma 112.

FIG. 4 is a schematic view showing an ICP process chamber with a conductive cylindrical workpiece serving as an internal RF antenna, wherein a DC bias source 402 is connected to the workpiece according to yet another embodiment of the invention.

The DC bias source 402 enables potential energy to be easily controlled over a wide range on the workpiece surface so as to effect the control of ion energy.

FIG. 5 is a schematic view showing an ICP process chamber with a conductive cylindrical workpiece serving as an internal RF antenna, wherein a pulsed bias source is connected to the workpiece according to yet another embodiment of the invention.

Similarly to the DC bias source 402, the pulsed bias source 502 enables potential energy to be easily controlled over a wide range on the workpiece surface so as to effect the control of ion energy.

In this case, pulses of the pulsed bias source 502 have an amplitude of from 100 to 200,000 V, preferably 500 to 5,000

V, and a width of from 0.2 to 200 ms, preferably 0.5 to 5 ms. also, the pulses of the pulsed bias source has a pulse duty factor of from 0.001 to 0.5. The pulsed bias can be applied at any instant relative to RF burst when pulsed RF plasma discharge is used.

Among the above range values, when the voltage of the pulses is less than or equal to the lowest limit value, there are no effects of the pulsed bias needed when the present plasma process is performed. The maximum value is a general limit value which can be applied industrially. In addition, when the width and pulse duty factor of the pulses is less than or equal to the lowermost limit value, the pulses become close to a general DC bias, but not the pulsed bias. On the contrary, when the width and pulse duty factor of the pulses is greater than the uppermost limit value, efficiency of the process using plasma is rather deteriorated.

FIG. 6 is a schematic view showing an ICP process chamber with a conductive cylindrical workpiece 612 serving as an internal RF antenna, wherein a sputter source surrounds the workpiece to provide PVD, ionized PVD, etching/PVD, or PI3D process according to yet another embodiment of the invention.

In other words, a cylindrical electrode 604 serving as both an injector for evenly supplying a process gas 606 and a sputter deposition source and a bias source 602 connected to the electrode are positioned within the vacuum chamber in such a fashion as to surround the workpiece in a coaxial direction to the workpiece. Also, the CIP process chamber 100 may include a vacuum pump 610 for maintaining the vacuum chamber in a vacuum state.

FIG. 7 is a schematic view showing an ICP process chamber with a conductive cylindrical workpiece serving as an internal RF antenna, where a sample heater 702 is provided inside the workpiece according to yet another embodiment of the invention.

That is, the temperature of the cylindrical workpiece (or substrate) 612 can be controlled through the heating and cooling of the sample heater 702 positioned within the cylindrical workpiece at an atmosphere pressure.

FIG. 8 is a schematic view showing an ICP process chamber with a conductive cylindrical workpiece serving as an internal RF antenna, wherein a coil is mounted inside the workpiece to provide a magnetic field along the outer circumferential surface of the workpiece according to yet another embodiment of the invention.

That is, in case where the cylindrical workpiece 804 is made of a non-magnetic material, a coil 802 is coaxially mounted inside the cylindrical workpiece and current flows in the coil, so that a magnetic field is formed along the outer circumferential surface of the nonmagnetic workpiece. This provides higher plasma density, enhances its uniformity along the workpiece, confines plasma in the workpiece vicinity, and suppresses emission of secondary electrons from the workpiece surface.

In this case, the strength of the magnetic field is adjusted to provide resonance increase of RF power absorption by the plasma 112. Also, the strength of the magnetic field is adjusted to minimize escape of secondary electrons from the cylindrical workpiece 804.

FIG. 9 is a schematic view showing an ICP process chamber with a conductive cylindrical workpiece serving as an internal RF antenna, and a pair of Helmholtz coils 902 for plasma confinement and plasma density increase, according to yet another embodiment of the invention;

In other words, plasma is confined in the vicinity of the cylindrical workpiece by a magnetic field 904 generated from the pair of Helmholtz coils. At this time, the pair of Helmholtz coils is fixedly mounted outside the process chamber coaxially with the workpiece so as to generate a magnetic field.

In this case, the strength of the magnetic field 904 is adjusted to provide resonance increase of RF power absorption by the plasma 112. Also, the strength of the magnetic field 904 is adjusted to minimize escape of secondary electrons from the cylindrical workpiece 612.

FIG. 10 is a schematic view showing an ICP process chamber with a conductive cylindrical workpiece serving as an internal RF antenna, according to yet another embodiment of the invention.

An RF power source 1004 is connected in parallel with a pulsed bias source 1002, and is disposed below the conductive cylindrical workpiece 1006. The actual operation of the ICP process chamber shown in FIG. 10 is the same as that of the ICP process chamber shown in FIG. 5.

FIG. 11 is a photograph of experiment setup wherein an Al 6061 cylindrical substrate 1104 (dia 80×200 mm) is mounted within a 18-liters PI3D chamber to serve as an internal antenna of an ICP source.

FIG. 12 is an oscillogram showing the measurement result of an RF voltage (Ch. 1) and current (Ch. 3) through the cylindrical workpiece in the ICP setup shown in FIG. 11. In FIG. 12, it is noted that RF self-bias of the cylindrical substrate is −208 V, RF power $P_{RF}$ of Ar plasma is 800 W, and the pressure $p_{Ar}$ of the plasma is 5 mTorr.

In the meantime, although a single process chamber has been described as an example, plasma cleaning, activating, surface smoothing, dry anisotropic etching, repetitive etch-deposition, PECVD, ICP-assisted PVD, including ionized PVD at higher pressure, and PI3D can be implemented within at least one or more process chambers, but not limited to a single process chamber as in the above embodiment.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. The scope of the present invention should be defined by the appended claims and equivalents thereof.

The invention claimed is:

1. An inductively coupled plasma processing reactor for a cylindrical workpiece with a three-dimensional profile, the plasma processing reactor comprising:
   a grounded vacuum chamber made of a conductive material and having an outer wall;
   workpiece bearing means connected to the outer wall of the vacuum chamber in such a fashion as to be electrically insulated from the vacuum chamber;
   at least one cylindrical workpiece mounted around the workpiece bearing means, the cylindrical workpiece being connected to an external RF power source through an impedance matching network at one end and a terminating capacitor at the other end; and
   a cylindrical gas shower electrode disposed inside the vacuum chamber so as to surround the workpiece.

2. The inductively coupled plasma processing reactor according to claim wherein the cylindrical workpiece is made of a conductive material.

3. The inductively coupled plasma processing reactor according to claim 2, wherein the cylindrical workpiece is either any one of aluminum, titanium, stainless steel and brass, or a combination of two or more thereof.

4. The inductively coupled plasma processing reactor according to claim 1, further comprising a conductive mesh formed on the inner circumferential surface of the cylindrical workpiece, wherein the cylindrical workpiece is made of an insulating material.

5. The inductively coupled plasma processing reactor according to claim 1, wherein the gas shower electrode is combined with a sputter electrode.

6. The inductively coupled plasma processing reactor according to claim 1, wherein the inside of the cylindrical workpiece is separated from the process chamber by vacuum sealing, and cooling water is allowed to be introduced into the cylindrical workpiece.

7. The inductively coupled plasma processing reactor according to claim 1, further comprising a temperature control heater coaxially disposed within the conductive cylindrical workpiece for controlling the temperature of the cylindrical workpiece.

8. The inductively coupled plasma processing reactor according to claim 1, further comprising a coil coaxially mounted inside the cylindrical workpiece, wherein the cylindrical workpiece is made of a non-magnetic material.

9. The inductively coupled plasma processing reactor according to claim 1, further comprising a pair of Helmholtz coils fixedly mounted outside the process chamber coaxially with the workpiece so as to generate a magnetic field.

10. The inductively coupled plasma processing reactor according to claim 1, further comprising workpiece rotating means connected to the workpiece bearing means for rotating the cylindrical workpieces.

11. The inductively coupled plasma processing reactor according to claim 1, further comprising a negative DC or pulsed DC bias source connected to the cylindrical workpiece to provide its biasing inside the process chamber.

12. The inductively coupled plasma processing reactor according to claim 11, wherein pulses of the pulsed DC bias source (502) have an amplitude of from 100 to 200,000 V, a width of from 0.2 to 200 ms, and a pulse duty factor of from 0.001 to 0.5.

13. The inductively coupled plasma processing reactor according to claim 1, wherein a frequency of the RF power source (106) is selected so to minimize a standing wave effect and a transmission line effect along the cylindrical workpiece.

14. The inductively coupled plasma processing reactor according to claim 1, wherein the workpiece bearing means is connected to the ground.

15. The inductively coupled plasma processing reactor according to claim 8, wherein the strength of the magnetic field is adjusted to provide resonance increase of RF power absorption by the plasma and minimize escape of secondary electrons from the cylindrical workpiece.

16. The inductively coupled plasma processing reactor according to claim 9, wherein the strength of the magnetic field is adjusted to provide resonance increase of RF power absorption by the plasma and minimize escape of secondary electrons from the cylindrical workpiece.

17. A method of plasma processing a cylindrical workpiece with a three-dimensional profile using a plasma processing reactor comprising: a grounded vacuum chamber made of a conductive material and having an outer wall; workpiece bearing means connected to the outer wall of the vacuum chamber in such a fashion as to be electrically insulated from the vacuum chamber; at least one cylindrical workpiece mounted around the workpiece bearing means, the cylindrical workpiece being connected to an external RF power source through an impedance matching network at one end and a terminating capacitor at the other end; and a cylindrical gas shower electrode disposed inside the vacuum chamber so as to surround the workpiece, the method comprising the steps of:

(a) applying RF power to the cylindrical workpiece through the impedance matching network;

(b) forming plasma inside the vacuum chamber through generation of resonance by the applied RF power;

(c) creating a negative DC selfbias on the workpiece due to a difference in mobility of ions and electrons; and (d) processing the workpiece using plasma ions accelerated within the formed plasma.

18. The method according to claim 17, wherein the step (d) further comprises (e) evenly supplying a process gas to the surface of the workpiece through the gas shower electrode.

* * * * *